(12) United States Patent
Paumier et al.

(10) Patent No.: US 8,635,259 B2
(45) Date of Patent: Jan. 21, 2014

(54) BARREL SHIFTER

(75) Inventors: Laurent Paumier, Grenoble (FR);
Pascal Urard, Theys (FR)

(73) Assignee: STMicroelectronics S.A., Montrouge (FR)

( * ) Notice: Subject to any disclaimer, the term of this patent is extended or adjusted under 35 U.S.C. 154(b) by 825 days.

(21) Appl. No.: 12/777,958

(22) Filed: May 11, 2010

(65) Prior Publication Data

US 2010/0293212 A1 Nov. 18, 2010

Related U.S. Application Data

(63) Continuation of application No. 11/418,169, filed on May 4, 2006, now abandoned.

(30) Foreign Application Priority Data

May 4, 2005 (FR) ...................................... 05 51182

(51) Int. Cl.
*G06F 15/00* (2006.01)

(52) U.S. Cl.
USPC .......................................................... 708/209

(58) Field of Classification Search
USPC .......................................................... 708/209
See application file for complete search history.

(56) References Cited

U.S. PATENT DOCUMENTS

| | | | |
|---|---|---|---|
| 4,490,809 A | | 12/1984 | Ueda et al. |
| 4,631,703 A | * | 12/1986 | Sakamoto ........................ 377/64 |
| 4,829,460 A | | 5/1989 | Ito |
| 5,481,749 A | * | 1/1996 | Grondalski ...................... 712/16 |
| 6,308,189 B1 | * | 10/2001 | Nguyen ........................ 708/209 |
| 6,449,328 B1 | | 9/2002 | Hanna |
| 2007/0088772 A1 | | 4/2007 | Nunes et al. |

FOREIGN PATENT DOCUMENTS

WO WO 2004/044731 A2 5/2004

OTHER PUBLICATIONS

French Search Report from French Patent Application 05/51182, filed May 4, 2005.
Brackenbury L.E.M., et al. "Universal Shift Matrix" IEE Proceedings E. Computers & Digital Techniques, Institution of Electrical Engineers, Stevenage, GB, vol. 137, No. 1, PART E, Jan. 1990, pp. 57-65 XP000094938.

* cited by examiner

*Primary Examiner* — Chuong D Ngo
(74) *Attorney, Agent, or Firm* — Wolf, Greenfield & Sacks, P.C.

(57) ABSTRACT

A barrel shifter receiving N symbols, arranged $n_2$ distinct groups of $n_1$ symbols, applying a circular shift to the N symbols. The barrel shifter comprises $n_2$ first barrel shifters, each applying a first circular shift to one of the groups of $n_1$ symbols; a rearrangement module receiving the N symbols provided by the first barrel shifters and providing N symbols arranged, in a determined manner, in $n_1$ distinct groups of $n_2$ symbols; $n_1$ second barrel shifters, each applying a second circular shift to one of the distinct groups of $n_2$ symbols; a control module providing, to each first barrel shifter, an identical signal bs_ctrl1 representing the first shift, and providing, to each second barrel shifter, an identical signal bs_ctrl2 representing the second shift; and a switching module switching at least two of the symbols of the N symbols.

19 Claims, 6 Drawing Sheets

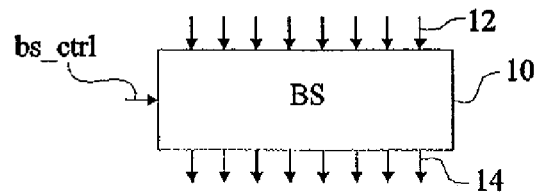
Fig 1
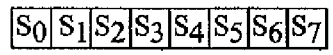
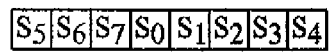
Fig 2
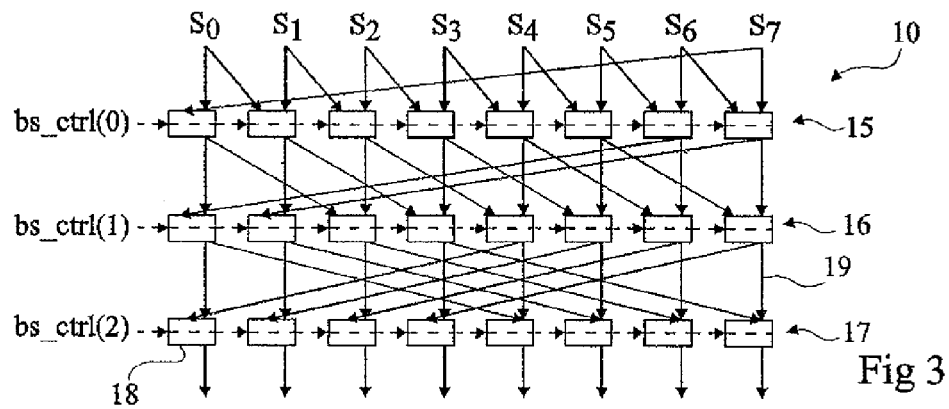
Fig 3
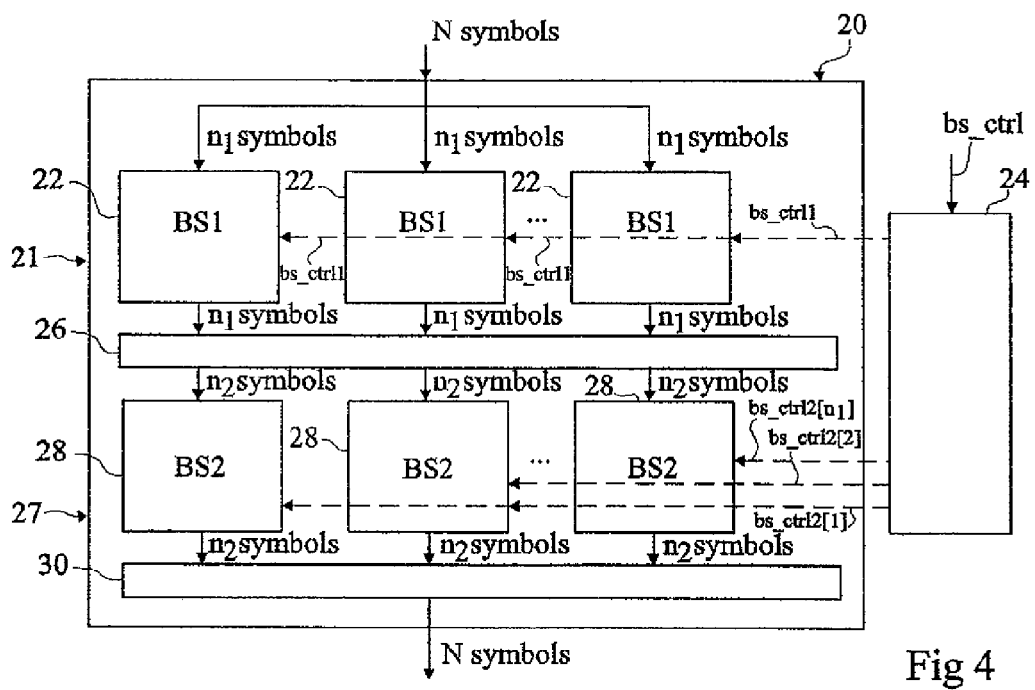
Fig 4

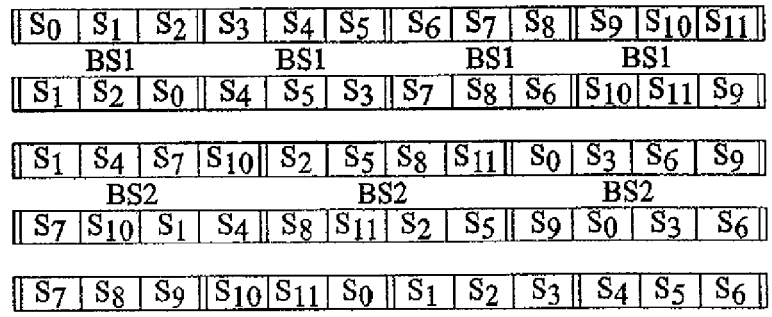
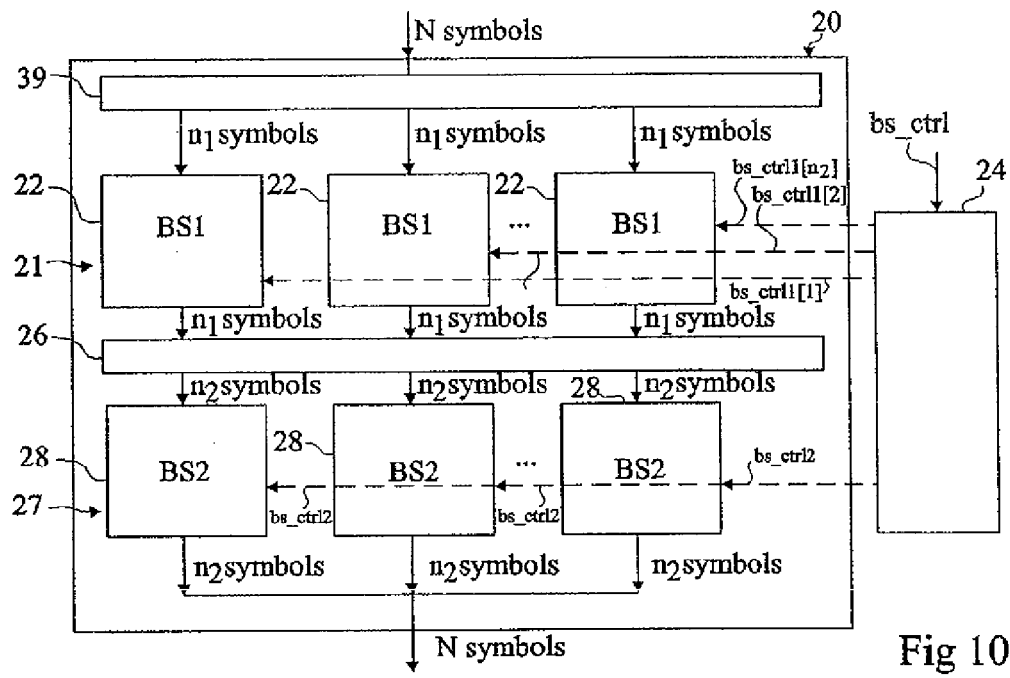
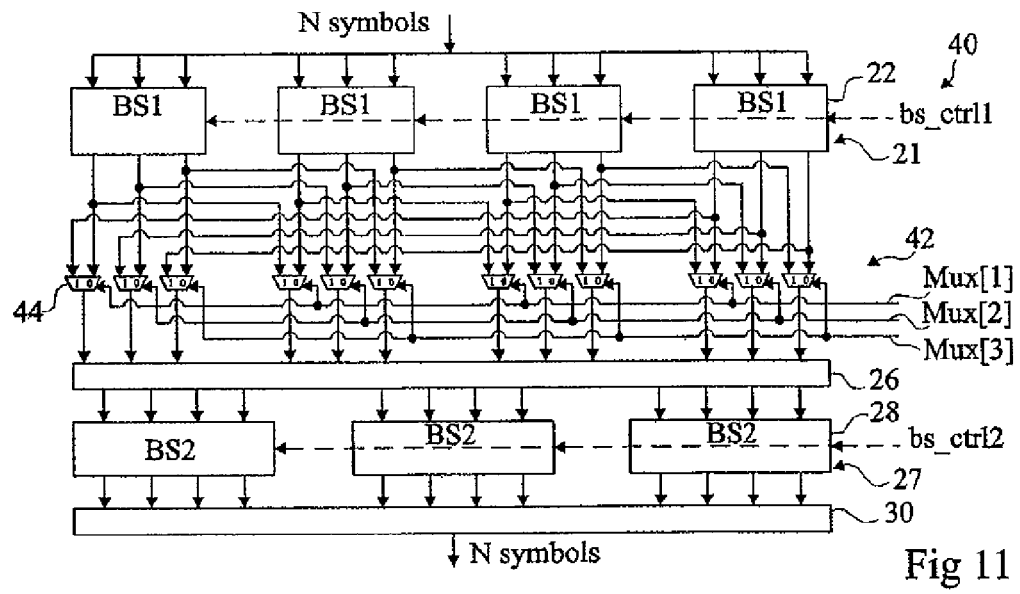
Fig 9
Fig 10
Fig 11

BARREL SHIFTER

CROSS REFERENCE TO RELATED APPLICATIONS

This application is a continuation of U.S. patent application Ser. No. 11/418,169, filed on May 4, 2006, which application claims priority benefit of French patent application number 05/51182, filed on May 4, 2005, which applications are hereby incorporated by reference to the maximum extent allowable by law.

BACKGROUND OF THE INVENTION

1. Field of the Invention

The present invention relates to a barrel shifter for symbols.

2. Discussion of the Related Art

An example of an application of a barrel shifter device relates to decoding symbols transmitted according to the DVB-S2 standard using an error correction code of the type LDPC (Low Density Parity Check).

FIG. 1 schematically shows a barrel shifter 10 (BS) receiving N symbols 12 in parallel arranged in a certain order, each symbol corresponding to a coded digital message of a determined number of bits nbit_data. The device 10 outputs in parallel N symbols 14, which correspond to N received symbols 12, on which a circular shift has been applied, to the left or to the right, by a number of positions which can be chosen to be between 0 and N−1. The barrel shifter 10 receives a control signal bs_ctrl from which the number of positions that the received symbols 12 are to be shifted can be determined.

FIG. 2 shows an example of a shift operation applied to eight symbols $S_0$ to $S_7$. The top line shows an example of the positioning of symbols $S_0$ to $S_7$ as received by the barrel shifter 10 and the bottom line shows the positioning of symbols output by the device 10 after the application of a circular shift to the right by three positions (which is equivalent to a circular shift to the left by five positions).

FIG. 3 shows an example of a classic implementation of a barrel shifter 10 receiving eight symbols and adapted to perform a circular shift to the right by 0 to 7 positions. The device 10 comprises three rows 15, 16, 17 of multiplexers. Each block 18 represents a multiplexing module receiving two symbols and outputting one of the two symbols received and comprising nbit_data multiplexers. Each solid arrow 19 corresponds to a path taken by a symbol, in other words, in practice, to connecting leads or connecting wires allowing the transmission of nbit_data bits. The multiplexers of the first, second and third rows 15, 16, 17 are respectively controlled by control signals bs_ctrl(0), bs_ctrl(1), and bs_ctrl(2).

Such a barrel shifter is said to have a logarithmic structure because each row of multiplexers allows a circular shift by a number of positions rising by a power of 2. Indeed, the first row 15 allows a circular shift to the right of one position ($2^0$), the second row 16 allows a circular shift to the right of two positions ($2^1$), and the third row 17 allows a circular shift to the right of four positions ($2^2$). By combining control bits bs_ctrl(0), bs_ctrl(1) and bs_ctrl(2), any shift from 0 to 7 positions can be performed.

In general, a barrel shifter 10 having a logarithmic structure and receiving N symbols requires, for performing a circular shift of anything from 0 to N−1 positions, ceil($\log_2$(N)) rows of multiplexers where $\log_2$(N) is the logarithm to the base 2 of N, and ceil($\log_2$(N)) is the greater integer value of $\log_2$(N). This device 10 therefore comprises N*nbit_data*ceil($\log_2$(N)) multiplexers. The logarithmic structure allows the number of multiplexers necessary for providing a shift operation to be minimized.

During fabrication of a barrel shifter, computer aided design utilities are generally used that indicate the surface area that will theoretically be sufficient for arranging the multiplexers while taking into account the minimum separation distances to be provided between each multiplexer and the true surface area necessary for arranging the multiplexers and the connecting wires or tracks between them. The difference between the two surfaces is called the overhead.

One difficulty during application of a barrel shifter with logarithmic structure is due to the large irregularity in the lengths of the paths 19 and the large number of junctions between paths 19 required by the arrangement of multiplexers. This leads to a large increase of the surface overhead when the number of symbols and/or the number of bits per symbol becomes large. For example, for a decoder of LDPC code, the product of N*nbit_data can be larger than 2000. The surface overhead can therefore be larger than 300% for a barrel shifter with logarithmic structure. This results in barrel shifters which are very bulky.

Another drawback comes from the fact that an increase in the surface area of a barrel shifter brings about an increase in the length of at least some of the paths taken by symbols. A problem is that transmission time of a symbol along a path depends on the path length. If the transmission time of symbols (or at least of some of them) is too large, it may not be possible to perform a shift operation in one cycle of the clock which controls the operation of the barrel shifter. It is therefore necessary to provide, between the rows of the barrel shifter, memory elements (for example, latches) so that a shift operation can be performed over a number of clock cycles. The addition of memory elements contributes to the increase in the surface area occupied by the barrel shifter.

In certain cases, a vicious circle can result whereby the addition of memory elements brings about a rise in the length of paths of the symbols such that additional memory elements must be provided. It can therefore be necessary to impose a minimum duration for clock cycles below which a barrel shifter with a logarithmic structure having acceptable dimensions cannot be designed.

SUMMARY OF THE INVENTION

To achieve these objects and others, the present invention provides a barrel shifter for which the surface overhead is reduced.

Another object of the present invention is to provide a barrel shifter which can be realized with a number of multiplexers equal to or very slightly greater than the number of multiplexers of a barrel shifter with a logarithmic structure.

To achieve these objects, as well as others, the present invention provides, in at least one embodiment, a barrel shifter adapted to receive a number N of symbols in parallel, arranged into a number $n_2$ of distinct groups of a number $n_1$ symbols, and to apply a total circular shift to the N symbols of a determined number of positions, the device comprising:

$n_2$ first barrel shifters, each first barrel shifter being adapted to receive one of the distinct group of $n_1$ symbols and to apply a first circular shift to said group of $n_1$ symbols, the first shift depending on the total circular shift;

a rearrangement module adapted to receive the N symbols provided by the first barrel shifters and to provide N symbols arranged, in a determined manner, in $n_1$ distinct groups of $n_2$ symbols; and $n_1$ second barrel shifters, each second barrel shifter being adapted to receive one of the distinct group of $n_2$ symbols and to apply a second circular shift to said group of symbols, the second shift being dependent on the total shift.

According to one embodiment of the invention, the rearrangement module is adapted to provide, for a symbol received at an $i^{th}$ position amongst the N symbols provided by the first barrel shifters, said symbol at a $j^{th}$ position according to the following relationship:

$$j=\text{mod}(i,n_1)*n_2+\text{floor}(i/n_1)$$

where i is an integer between 0 and N−1, $\text{mod}(i,n_1)$ is the remainder of the whole division of i by $n_1$, and $\text{floor}(i/n_1)$ is the quotient of the whole division of i by $n_1$.

According to an embodiment of the invention, the barrel shifter comprises a control module adapted to receive a signal bs_ctrl representing a total shift and to provide, to each first barrel shifter, a signal bs_ctrl1 representing the first shift which depends on the total shift and which is identical for each first barrel shifter, and adapted to provide, to each second barrel shifter, a signal bs_ctrl2 representing the second shift which depends on the total shift and which is identical for each second barrel shifter, the barrel shifter further comprising a switching module adapted to switch at least two symbols amongst the N symbols.

According to an embodiment of the invention, the control module is adapted to provide the signal bs_ctrl1 according to the following relationship:

$$bs\_\text{ctrl1}=\text{mod}(bs\_\text{ctrl},n_1)$$

where $\text{mod}(bs\_\text{ctrl},n_1)$ is the remainder of the whole division of bs_ctrl by $n_1$, and adapted to provide the signal bs_ctrl2 according to the following relationship:

$$bs\_\text{ctrl2}=\text{floor}(bs\_\text{ctrl}/n_1)$$

where $\text{floor}(bs\_\text{ctrl}/n_1)$ is the quotient of the whole division of bs_ctrl by $n_1$, the barrel shifter further comprising an auxiliary rearrangement module adapted to receive the N symbols provided by the second barrel shifters and, for a symbol received at an $i^{th}$ position, to provide said symbol at a $j^{th}$ position according to the following relationship:

$$j=\text{mod}(i,n_2)*n_1+\text{floor}(i/n_2)$$

where i is an integer between 0 and N−1, $\text{mod}(i/n_2)$ is the remainder of the whole division of i by $n_2$, and $\text{floor}(i/n_2)$ is the quotient of the whole division of i by $n_2$, the switching module comprising N multiplexing modules, each multiplexing module receiving a first symbol at a relative position k, k being an integer between 1 and $n_1$, amongst the $n_1$ symbols provided by a first barrel shifter and a second symbol at said relative position k amongst the $n_1$ symbols provided by an adjacent first barrel shifter and providing the second symbol when k is less than or equal to bs_ctrl1 and the first symbol when k is greater than bs_ctrl1.

According to an embodiment of the invention, the control module is adapted to provide the signal bs_ctrl1 according to the following relationship:

$$bs\_\text{ctrl1}=\text{floor}(bs\_\text{ctrl}/n_2)$$

where $\text{floor}(bs\_\text{ctrl}/n_2)$ is the quotient of the whole division of bs_ctrl by $n_2$, and adapted to provide the signal bs_ctrl2 according to the following relationship:

$$bs\_\text{ctrl2}=\text{mod}(bs\_\text{ctrl},n_2)$$

where $\text{mod}(bs\_\text{ctrl},n_2)$ is the remainder of the whole division of bs_ctrl by $n_2$, the barrel shifter further comprising an auxiliary rearrangement module adapted to receive the N symbols and to provide the N symbols to the first barrel shifters in such a way that, for a symbol received at an $i^{th}$ Position, said symbol is provided at a $j^{th}$ position according to the following relationship:

$$j=\text{mod}(i,n_2)*n_1+\text{floor}(i/n_2)$$

where i is an integer between 0 and N−1, $\text{mod}(i,n_2)$ is the remainder of the whole division of i by $n_2$, and $\text{floor}(i/n_2)$ is the quotient of the whole division of i by $n_2$, the switching module comprising N multiplexing modules, each multiplexing module receiving a first symbol at a relative position k, k being an integer between 1 and $n_2$, in the group of $n_2$ symbols amongst the N symbols received by said barrel shifter and a second symbol at said relative position k in an adjacent group of $n_2$ symbols and providing, to the auxiliary rearrangement module, the first symbol when k is less than or equal to the difference between $n_2$ and bs_ctrl2 and the second symbol when k is greater than the difference between $n_2$ and bs_ctrl2.

The present invention also provides a decoder comprising processors linked to memory elements and to a barrel shifter as described above, in which the processors and the memory elements are arranged in first and second concentric rings, and in which the first or second barrel shifters of the barrel shifter are arranged into a third ring concentric with the first and second rings.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 1, described above, shows the interfaces of a classic barrel shifter;

FIG. 2, described above, illustrates an example of shifting performed by a barrel shifter;

FIG. 3, described above, shows a classic barrel shifter having a logarithmic structure;

FIG. 4 shows an example of a barrel shifter;

FIG. 9 illustrates the operation of the device of FIG. 8;

FIG. 10 shows a variation of the example shown in FIG. 4;

FIG. 11 shows a first example of a barrel shifter according to the invention;

DETAILED DESCRIPTION

Figure 5:
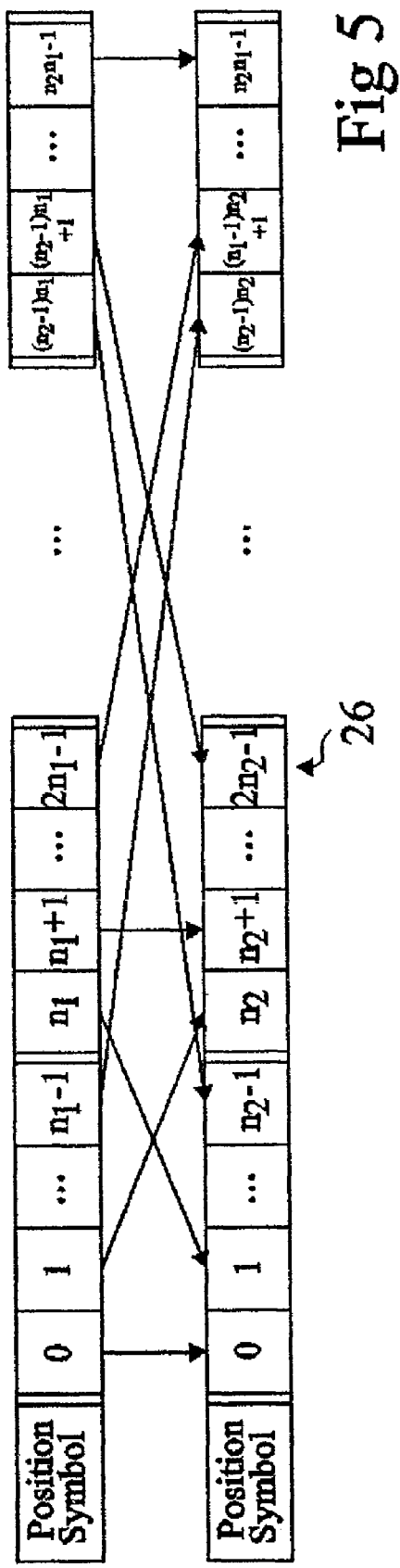
FIGS. 5 to 7 show in more detail the elements of the barrel shifter of FIG. 4.

For reasons of clarity, the same elements have been labeled with the same reference characters in the different figures.

The present invention provides a barrel shifter receiving N symbols and comprising at least two successive stages, each comprising a determined number, possibly different per stage, of elementary barrel shifters, the elementary barrel shifters of the first stage being linked to the elementary barrel shifters of the second stage. Each elementary barrel shifter receives only one part of N symbols on which it performs a shift operation. The present invention allows a limitation of the variation in lengths and the number of junctions of the paths of the barrel shifter, and therefore limitation of the surface area overhead of the barrel shifter.

FIG. 4 shows the general structure of an example of a barrel shifter 20. The device 20 receives N symbols, each symbol being comprised of nbit_data bits, and outputs N symbols on which a circular shift (barrel shift) is performed. The N symbols are arranged in $n_2$ groups of $n_1$ symbols, the first group comprising the $n_1$ first symbols of the N symbols, the second group comprising the following $n_1$ symbols, etc. The device 20 comprises a first stage 21 of $n_2$ elementary barrel shifters (BS1) 22. Each elementary barrel shifter 22 receives a group of $n_1$ symbols and performs a circular shift to the right on the $n_1$ received symbols of a number of positions between 0 and $n_1-1$ positions. The barrel shifter 20 is controlled by a control module 24 which receives a control signal bs_ctrl based on which it outputs the same signal bs_ctrl1 to each elementary device 22 representing the number of shift positions to be performed by each elementary device 22. The $n_2$ groups of $n_1$ symbols provided by the $n_2$ elementary devices 22 are transmitted to a rearrangement stage 26 which modifies, in a determined fashion, the positions of the N symbols such that $n_1$ groups of $n_2$ symbols are formed. The $n_1$ groups of $n_2$ symbols are provided to a second stage 27 of elementary barrel shifters (BS2) 28. Each elementary device 28 receives a group of $n_2$ symbols and performs a circular shift to the right on the $n_2$ symbols received by a number of positions between 0 and $n_2-1$ positions. The elementary devices 28 receive control signals bs_ctrl2[1] to bs_ctrl2[$n_1$] respectively provided by the control device 24 based on the control signal bs_ctrl. The elementary devices 28 of the second stage 27 of the elementary devices can therefore perform different shifts on the group of $n_2$ symbols received. The $n_1$ groups of $n_2$ symbols provided by the elementary devices 28 are transmitted to a rearrangement stage 30 which modifies, in a determined fashion, the positions of the N symbols. In practice, the rearrangement stages 26, 30 correspond to a particular arrangement of the paths followed by the symbols.

The signal bs_ctrl is a binary signal representing the number of shift positions to be performed by the device 20.

Taking the example of the barrel shifter 20 shown in FIG. 4, we can perform a circular shift to the right by a number of positions given by the signal bs_ctrl. The control signal bs_ctrl1 is given by the following relationship:

$$bs\_ctrl1 = \mathrm{mod}(bs\_ctrl, n_1)$$

where $\mathrm{mod}(bs\_ctrl, n_1)$ is the modulo of bs_ctrl by $n_1$, in other words the remainder of the whole division of bs_ctrl by $n_1$. Each elementary device 22 therefore performs a shift to the right on the $n_1$ symbols received by bs_ctrl1 positions.

The control signals bs_ctrl2[k], for k being an integer between 1 and $n_1$, are given by the following relationships:

$$bs\_ctrl2[k] = \mathrm{floor}(bs\_ctrl/n_1) + 1 \text{ for } k \leq bs\_ctrl1$$

$$bs\_ctrl2[k] = \mathrm{floor}(bs\_ctrl/n_1) \text{ for } k > bs\_ctrl1$$

where $\mathrm{floor}(bs\_ctrl/n_1)$ is the integer just lower than bs_ctrl/$n_1$, i.e. the whole part of bs_ctrl/$n_1$, in other words the quotient of the whole division of bs_ctrl by $n_1$.

It appears therefore that, for the second stage 27 of elementary devices, the bs_ctrl1 first elementary devices 28 each perform a circular shift to the right of $\mathrm{floor}(bs\_ctrl/n_1)+1$ positions on the $n_2$ symbols received and the $n_1$-bs_ctrl1 other elementary devices 28 each perform a circular shift to the right of $\mathrm{floor}(bs\_ctrl/n_1)$ positions on the $n_2$ symbols received.

In order to achieve a shift to the left by a number of positions given by the signal bs_ctrl as shown in the example of the device 20 shown in FIG. 4, device 20 can be controlled with a signal bs_ctrl' equal to mod(N-bs_ctrl,N).

Each elementary device 22, 28 can be of a logarithmic type. Each elementary device 22 then comprises $n_1$*nbit_data*ceil($\log_2(n_1)$) multiplexers, and each elementary device 28 comprises $n_2$*nbit_data*ceil($\log_2(n_2)$) multiplexers. If a barrel shifter 20 comprising the same number of multiplexers as a barrel shifter with logarithmic structure is required, the integers $n_1$ and $n_2$ must satisfy the following relationship:

$$\mathrm{ceil}(\log_2(n_1)) + \mathrm{ceil}(\log_2(n_2)) = \mathrm{ceil}(\log_2(N))$$

FIG. 5 shows an example of the rearrangement stage 26 of FIG. 4. The top row represents the positions 0 to $n_2$*$n_1$-1 symbols received by the rearrangement stage 26. For clarity, the groups of $n_1$ positions have been regrouped, illustrating the groups of $n_1$ symbols provided by the elementary devices 22. Similarly, the bottom row represents the positions 0 to $n_1$*$n_2$-1 of the symbols provided by the rearrangement stage 26. For clarity, the positions have been regrouped into groups of $n_2$ positions, illustrating the groups of $n_2$ symbols provided to the elementary devices 28.

In general, the rearrangement stage 26 transmits a symbol received at a position i, i being an integer between 0 and $n_2$*$n_1$-1, to a position j, j being an integer between 0 and $n_2$*$n_1$-1, according to the following relationship:

$$j = \mathrm{mod}(i, n_1)*n_2 + \mathrm{floor}(i/n_1)$$

Figure 6:
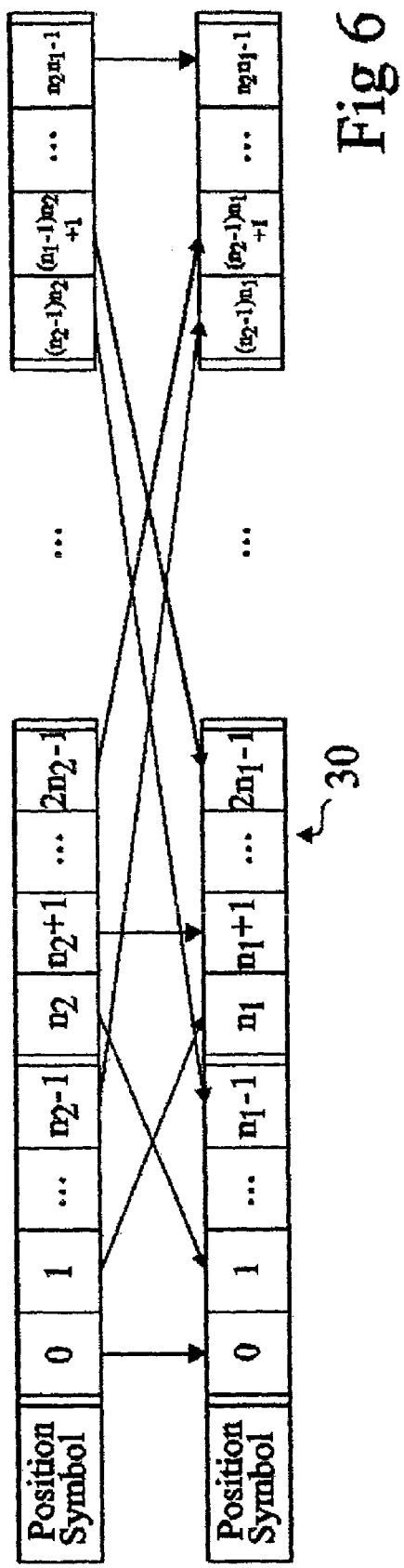

FIG. 6 shows an example of the rearrangement stage 30. In the same way as described in relation with FIG. 5, the positions 0 to $n_2$*$n_1$-1 of the symbols received by the rearrangement stage 30 have been regrouped, in the top row, into groups of $n_2$ positions, illustrating the groups of $n_2$ symbols provided by the elementary devices 28 and the position 0 to $n_2$*$n_1$-1 of the symbols provided by the rearrangement stage 30 have been regrouped, in the bottom row, in groups of $n_1$ positions.

In general, the rearrangement stage 30 transmits a symbol received at a position i, i being an integer between 0 and $n_2$*$n_1$-1, to a position j, j being an integer between 0 and $n_2$*$n_1$-1 according to the following relationship:

$$j = \mathrm{mod}(i, n_2)*n_1 + \mathrm{floor}(i/n_2)$$

Figure 7:
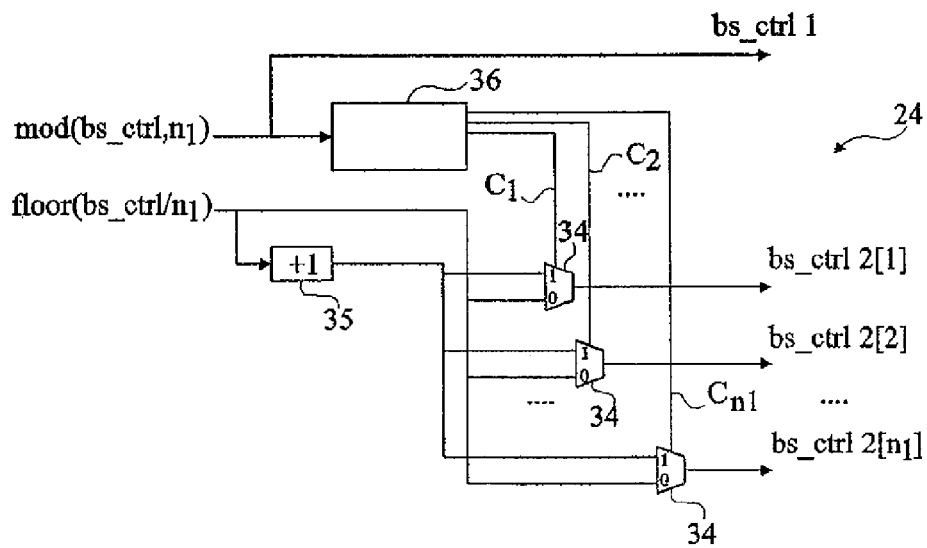

FIG. 7 illustrates an example of the control device 24. The determination of the different control signals can be determined based on the signal bs_ctrl by determining the signals mod(bs_ctrl,$n_1$) and floor(bs_ctrl,$n_1$). The signal mod(bs_ctrl,$n_1$) corresponds directly to the control signal bs_ctrl1. The signal floor(bs_ctrl/$n_1$) is transmitted to the first inputs of $n_1$ multiplexers 34. A module 35 also receives the signal floor (bs_ctrl/$n_1$) to which it adds 1. The output of module 35 is provided to the second inputs of multiplexers 34. The outputs of $n_1$ multiplexers 34 correspond respectively to signals bs_ctrl2[1] to bs_ctrl2[$n_1$]. The $n_1$ multiplexers 34 are controlled by $n_1$ control signals $c_1$ to $c_{n1}$ provided by a decoding module 36 which receives the signal mod(bs_ctrl,$n_1$). Assuming that k is equal to mod(bs_ctrl,$n_1$), the decoding module 36 provides the signals $c_1$ to $c_k$ at logic level 1, and the signals $c_{k+1}$ to $c_{n1}$ at logic level 0.

The operation of the barrel shifter 20 according to the exemplary embodiment shown in FIG. 4 will now be described in further detail for the particular example in which $n_1$=3 and $n_2$=4, i.e. for a barrel shifter 20 receiving twelve symbols $S_0$ to $S_{11}$ and adapted to provide a shift to the right of 0 to 11 positions.

Figure 8:
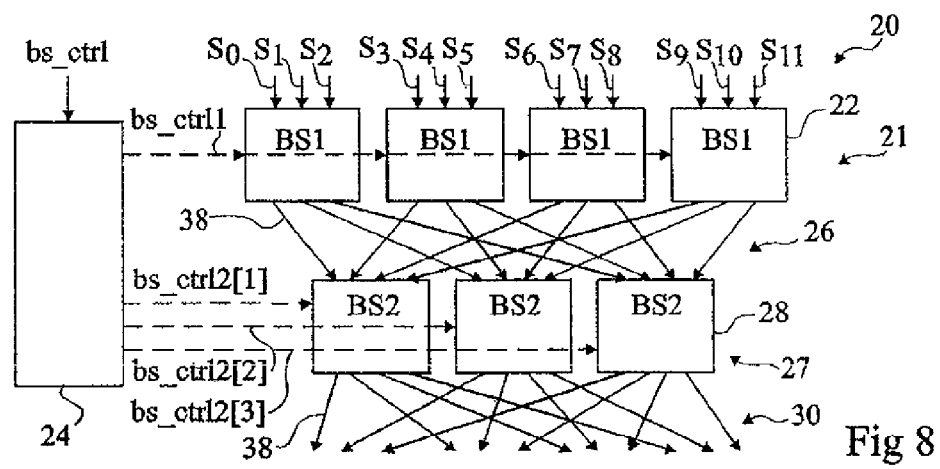
FIG. 8 shows an example of a barrel shifter adapted to process 12 symbols.

FIG. 8 shows the structure of such a barrel shifter 20, the rearrangement stages 26, 30 being represented by paths 38 connected to the elementary devices 22, 28.

FIG. 9 shows the positions occupied by symbols $S_0$ to $S_{11}$ during the operation of the device of FIG. 8 for providing a right shift of five positions. In particular, at the first, second, third, fourth and fifth lines of FIG. 9, the positions have been represented relative to the symbols $S_0$ to $S_{11}$ at:

the input of stage 21 of elementary devices 22;

the output of stage 21 of elementary devices 22 (the input of the rearrangement stage 26);

the output of rearrangement stage 26 (the input of stage 27 of the elementary devices 28);

the output of stage 27 of elementary devices 28 (the input of the rearrangement stage 30); and the output of the rearrangement stage 30.

In the present example, the signal bs_ctrl is equal to 5. Thus we have:

$$bs\_ctrl1 = \mathrm{mod}(5,3) = 2$$

Each elementary device 22 therefore performs a shift operation, on the three symbols received of two positions to the right.

The control signals bs_ctrl2[1], bs_ctrl2[2] and bs_ctrl2[3] are obtained in the following manner:

$$bs\_ctrl2[1] = bs\_ctrl2[2] = \mathrm{floor}(5/3) + 1 = 2$$

$$bs\_ctrl2[3] = \mathrm{floor}(5/3) = 1$$

The first and second elementary devices 28 (from left to right in FIG. 8) each performs a shift on the four symbols that they receive of two positions to the right, and a third elementary device 28 performs a shift on the four symbols that it receives of one position to the right.

The maximum dispersion of path lengths and the maximum number of junctions between paths are present only at the rearrangement stages 26, 30. Indeed, the elementary devices 22, 28 only each processing a reduced number of symbols, each thus has a path length dispersion and a number of path junctions limited even though they have a logarithmic structure. The surface overhead is therefore limited for a barrel shifter 20. Furthermore, as the device 20 is implemented with the same number of multiplexers as a device having a logarithmic structure, a barrel shifter is finally achieved which occupies a surface smaller than the surface occupied by a device having a logarithmic structure.

FIG. 10 illustrates a variation of the example of device 20 shown in FIG. 4. Compared with device 20 illustrated in FIG. 4, the rearrangement stage 30 has been removed. A rearrangement stage 39 receives the N symbols and provides $n_2$ groups of $n_1$ symbols to the elementary devices 22 of the first stage 21 of elementary devices. The structure of the rearrangement stage 39 is identical to the structure of rearrangement stage 30 illustrated in FIG. 6. The elementary devices 22 of the first stage 21 receive the control signals bs_ctrl1[1] to bs_ctrl1[$n_2$] respectively, provided by the control device 24 based on the control signal bs_ctrl. The elementary devices 22 of the first stage 21 of elementary devices can therefore provide different shifts on the groups of $n_1$ symbols received. Each elementary device 28 of the second stage 27 of elementary devices receives the same signal bs_ctrl2 representing the number of shift positions to be provided by each elementary device 28.

In the exemplary embodiment of the barrel shifter 20 represented in FIG. 10, a circular shift to the right can be performed of a number of positions given by the signal bs_ctrl. The control signal bs_ctrl2 is given by the following relationship:

$$bs\_ctrl2 = \mathrm{mod}(bs\_ctrl, n_2)$$

Each elementary device 28 therefore performs a shift to the right by bs_ctrl2 positions on the $n_2$ symbols received.

The control signals bs_ctrl1[k] for k being an integer between 1 and $n_2$, are given by the following relationships:

$$bs\_ctrl1[k] = \mathrm{floor}(bs\_ctrl/n_2) \text{ for } k \leq n_2 - bs\_ctrl2$$

$$bs\_ctrl1[k] = \mathrm{floor}(bs\_ctrl/n_2) + 1 \text{ for } k > n_2 - bs\_ctrl2$$

FIG. 11 illustrates a first example of an embodiment of a barrel shifter 40 according to the invention which will be described for a particular example in which N=12, $n_1$=3 and $n_2$=4. According to the first exemplary embodiment, the device 40 comprises, as for the exemplary embodiment represented in FIG. 4, stages 21, 27 of elementary devices 22, 28 and rearrangement stages 26, 30. Also, the elementary devices 22 receive the same control signal bs_ctrl1. However, in contrast to the exemplary embodiment represented in FIG. 4, the device 40 according to the first exemplary embodiment provides an identical control signal bs_ctrl2 to each elementary device 28. Because of this, each of the $n_1$ elementary devices 28 provides the same shift on the $n_2$ symbols received.

To achieve the shift required, the device 40 comprises a supplementary stage 42 comprising N multiplexing modules 44 positioned between stage 21 of elementary devices 22 and the rearrangement stage 26. Each multiplexing module 44 of stage 42 receives, at a first input, a symbol at a determined relative position amongst the $n_1$ symbols provided by an elementary device 22 and, at a second input, a symbol at the same determined relative position amongst the $n_1$ symbols provided by an adjacent elementary device 22 (i.e. the elementary device 28 to the left in the first example where a shift to the right is performed, the device "to the left" of elementary device 22 the furthest left in FIG. 11 corresponding to the elementary device 22 the furthest to the right).

The $n_2$ multiplexing modules, receiving the signals provided by the elementary devices 22 adjacent to a same position k relative to the $n_1$ symbols provided by each of the elementary devices 22, are controlled by the same control signal Mux[k]. In the example illustrated in FIG. 11, the multiplexing modules 44, receiving the signals in the first position of the three symbols provided by each elementary device 22, are controlled by a control signal Mux[1], the multiplexing modules 44, receiving the symbols in the second position of the three symbols provided by each elementary device 22, are controlled by a control signal Mux[2] and the multiplexing modules 44, receiving the symbols in the third position of the three symbols provided by each elementary device 22, are controlled by a control signal Mux[3].

The control signals Mux[k], k being an integer between 1 and $n_1$, are given by the following relationships:

$$\mathrm{Mux}[k] = 1 \text{ for } k \leq bs\_ctrl1; \text{ and}$$

$$\mathrm{Mux}[k] = 0 \text{ for } k > bs\_ctrl1$$

The control signal bs_ctrl1 is given by the following relationship:

$$bs\_ctrl1 = \mathrm{mod}(bs\_ctrl, n_1)$$

and the control signal bs_ctrl2 is given by the following relationship:

$$bs\_ctrl2 = \mathrm{floor}(bs\_ctrl, /n_1)$$

By adopting a logarithmic structure for the elementary devices 22, 28, the device 40 according to the first exemplary embodiment comprises N*nbit_data additional multiplexers when compared to a barrel shifter having a logarithmic structure. The device 40 according to the first exemplary embodiment nevertheless conserves all of the advantages of the exemplary embodiment shown in FIG. 4 in that it allows a reduction in the surface overhead compared to a barrel shifter having a logarithmic structure.

Figure 12:
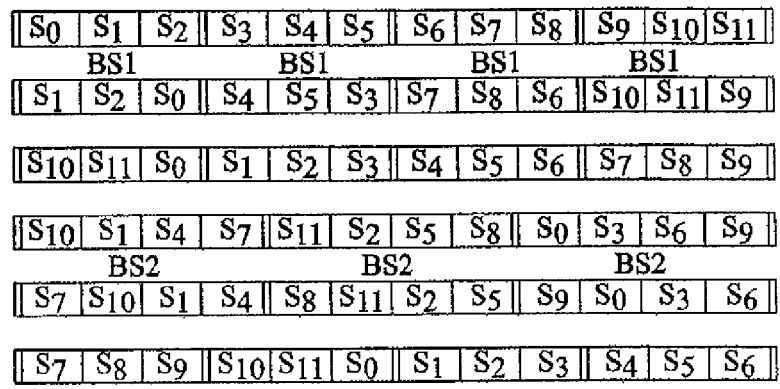
FIG. 12 illustrates the operation of the device of FIG. 10.

FIG. 12 illustrates the operation of device 40 according to the first exemplary embodiment of the invention in the same way as FIG. 9, for performing a shift by five positions to the right.

In particular, in the first, second, third, fourth, fifth and sixth lines of FIG. 12, the relative positions of the symbols $S_0$ to $S_{11}$ have been represented at:

the input of stage 21 of elementary devices 22;

the output of stage 21 of elementary devices 22 (the input of stage 42 of multiplexing modules 44);

the output of stage 42 of the multiplexing modules 44 (the input of the rearrangement stage 26);

the output of the rearrangement stage 26 (the input of stage 27 of elementary devices 28);

the output of stage 27 of elementary devices 28 (the input of the rearrangement stage 30); and the output of rearrangement stage 30.

In the present example, the signal bs_ctrl is equal to 5. This gives:

$$bs\_ctrl1 = \mathrm{mod}(5,3) = 2$$

Each elementary device 22 therefore performs a shift on the three symbols received of two positions to the right. Also, we have:

$$bs\_ctrl2 = \mathrm{floor}(5,3) = 1$$

Each elementary device 28 performs therefore a shift on the four symbols received of one position to the right.

Furthermore, MUX[1]=MUX[2]=1 and MUX[3]=0. This signifies that for each group of three symbols provided by an elementary device 22, the symbol in the third position is not modified and the symbols in the first and second positions are replaced by the symbols in the first and second positions of the three symbols provided by the elementary device 22 at the "left" of the elementary device 22 considered.

According to a variation of the first exemplary embodiment described above, an elementary device 22, 28 can itself be provided according to the first exemplary embodiment of the invention.

Figure 13:
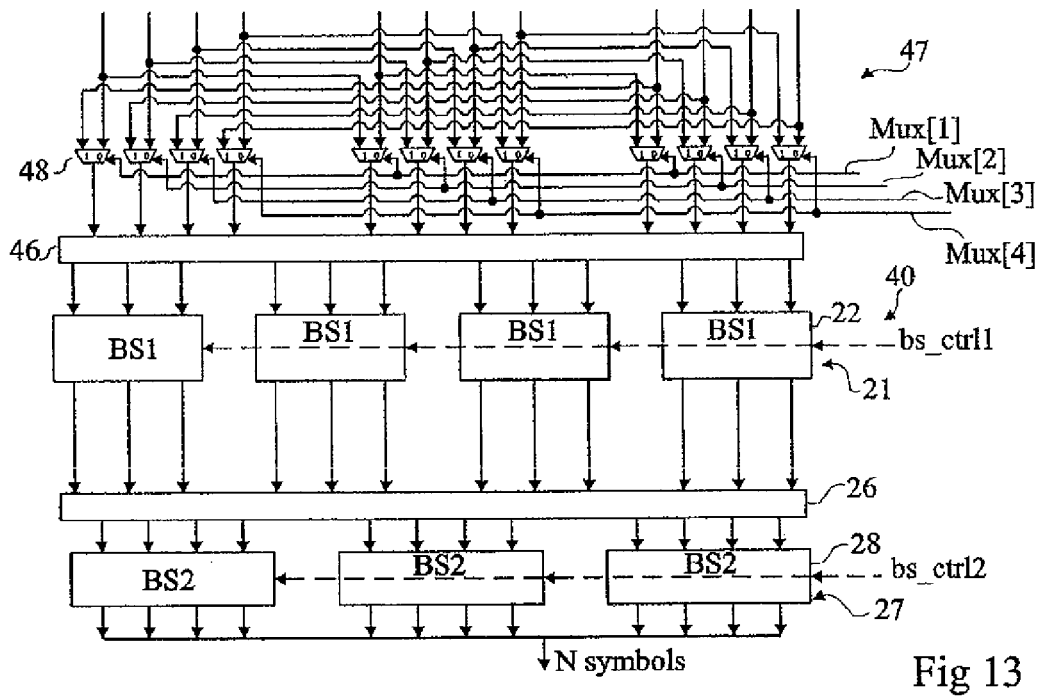
FIG. 13 shows a second example of a barrel shifter according to the invention.

FIG. 13 illustrates a second exemplary embodiment of device 40 according to the invention. When compared to the first exemplary embodiment of device 40 represented in FIG. 11, the rearrangement stage 30 is removed. A rearrangement stage 46 receives the N symbols and provides $n_2$ groups of $n_1$ symbols to the elementary devices 22 of the first stage 21 of elementary devices. The structure of the rearrangement stage 46 is identical to the structure of the rearrangement stage 30 illustrated in FIG. 6. An additional stage 47 comprising N multiplexing modules 48 is connected to the rearrangement stage 46. The stage 47 has the same structure as the structure of stage 42 of device 40 represented in FIG. 11 in that each multiplexing module 48 receives, at a first input, a symbol at a determined relative position in a group of $n_2$ symbols and, at a second input, a symbol at the same determined position in an adjacent group of $n_2$ symbols (i.e. the group of $n_2$ symbols situated at the left in the present example where a shift to the right is performed, the group of $n_2$ symbols "at the left" of the group of $n_2$ symbols the furthest to the left in FIG. 13 corresponding to the group of $n_2$ symbols the furthest to the right). Each group of $n_1$ multiplexing modules, receiving the symbols at a same relative position k in two adjacent groups of $n_2$ symbols, is controlled by a same control signal Mux[k].

The control signals Mux[k], k being an integer between 1 and $n_2$, are given by the following relationships:

$$\mathrm{Mux}[k] = 0 \text{ for } k \leq n_2 - bs\_ctrl2; \text{ and}$$

$$\mathrm{Mux}[k] = 1 \text{ for } k > n_2 - bs\_ctrl2$$

The elementary devices 22 receive the same control signal bs_ctrl1 given by the following relationship:

$$bs\_ctrl1 = \mathrm{floor}(bs\_ctrl/n_2)$$

and the elementary devices 28 receive the same control signal bs_ctrl2 given by the following relationship:

$$bs\_ctrl2 = \mathrm{mod}(bs\_ctrl, n_2)$$

In the first and second exemplary embodiments according to the invention described above, the control signals bs_ctrl1 and bs_ctrl2 are identical for the elementary devices 22 and 26 respectively. This advantageously allows the structure of the control device 24 to be simplified with respect to the structure represented in FIG. 7 relating to the exemplary embodiment of FIG. 4.

Figure 14:
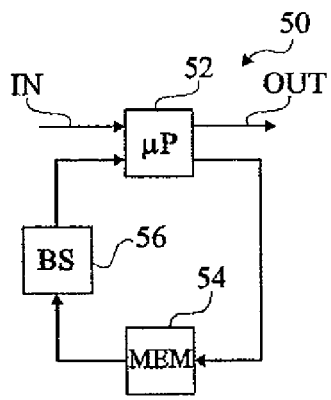
FIG. 14 schematically shows an example of an LDPC decoder using a barrel shifter.

FIG. 14 illustrates schematically an exemplary embodiment of a decoder 50 of LDPC code. The LDPC decoder 50 comprises processors (μP) 52 operating in parallel receiving the symbols IN and providing the symbols OUT by an iterative process. To do this, the decoder 50 comprises an iteration loop in which the symbols are stored in memories (MEM) 54 and are provided again to processors 52 after being subjected to a circular shift provided by a barrel shifter (BS) 56. Such a structure can also be implemented for a turbo-code decoder and, in general, for a decoder for iterative error correcting codes using a barrel shifter for interleaving the data used internally.

Figure 15:
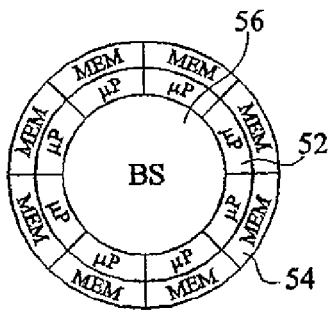
FIG. 15 schematically shows a classic example of the arrangement of elements of the decoder of FIG. 14 using a barrel shifter with logarithmic structure.

FIG. 15 is a schematic plan view that illustrates an example of the layout of elements of decoder 50 when decoder 50 is implemented in an integrated fashion, and when the barrel shifter 56 has a logarithmic structure. The memories 54 are arranged in an exterior ring and the processors 52 are arranged in an interior ring. The central region of the interior ring is occupied by the barrel shifter 56. With a logarithmic structure, $N*\mathrm{ceil}(\log_2(N))*nbit\_data$ multiplexers and the associated metal connecting tracks used for the implementation of electrical connections must be placed in the central region.

Figure 16:
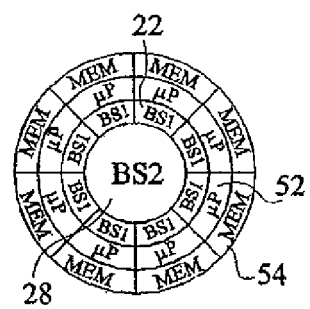
FIG. 16 shows an analog version of FIG. 15 for a LDPC decoder using the barrel shifter according to the invention.

FIG. 16 is the same view as that of FIG. 15 but shows the case where the barrel shifter 56 corresponds to the first or second exemplary embodiments according to the invention. The memories 54 and the processors 52 are provided in the form of rings. The present invention allows the arrangement of the first stage 21 of elementary devices 22 in the form of a ring in which the central region is occupied by the second stage 27 of elementary devices 28 (and possibly stages 42, 47 of multiplexing modules 44, 48). This is made possible by the fact that the first stage 21 comprises distinct elementary devices 22. In the central region, $N*\mathrm{ceil}(\log_2(n_2))*nbit\_data$ multiplexers must be placed (to which $N*nbit\_data$ multiplexers of the additional stage 42, 47 may possibly be added) and the corresponding metal tracks, i.e. a lower number than the number of multiplexers to be provided in the example illustrated in FIG. 15, thus simplifying the layout. According to a variation, the elementary devices 28 can be arranged in a ring in place of the elementary devices 22.

To maximize the reduction in the surface area overhead, a compromise must be found for the integers $n_1$ and $n_2$. Indeed, for reducing the surface occupied by the central region, the integer $n_2$ must be small. However, if $n_1$ is too large, the elementary devices 22 risk being of too large a volume and the final reduction in surface overhead would not be great. An acceptable compromise includes choosing $n_1$ approximately equal to $n_2$.

Naturally, the present invention is susceptible to various variations and modifications that would appear to those skilled in the art. In particular, memory elements can be provided between the two stages of elementary devices. Furthermore, although the barrel shifters described above are adapted to provide a shift to the right, it is clear that the present invention can be applied to an embodiment of a barrel shifter adapted to form a shift to the left.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A barrel shifter arranged to receive a number N of symbols in parallel, arranged in a number $n_2$ of distinct groups of a number $n_1$ of symbols, and to apply a total circular shift to the N symbols of a determined number of positions, the barrel shifter comprising:

$n_2$ first barrel shifters, each first barrel shifter being adapted to receive one of the distinct groups of $n_1$ symbols and to apply a first circular shift to said group of $n_1$ symbols, the first shift depending on the total shift;

a rearrangement module adapted to receive the N symbols provided by the first barrel shifters and to provide N symbols arranged, in a determined manner, in $n_1$ distinct groups of $n_2$ symbols;

$n_1$ second barrel shifters, each second barrel shifter being adapted to receive one of the distinct groups of $n_2$ symbols and to apply a second circular shift to said group of symbols, the second shift depending on the total shift;

a control module adapted to receive a signal bs_ctrl representing a total shift and to provide, to each first barrel shifter, a signal bs_ctrl1 representing the first shift that depends on the total shift and which is identical for each first barrel shifter, and adapted to provide, to each second barrel shifter, a signal bs_ctrl2 representing the second shift which depends on the total shift and which is identical for each second barrel shifter; and a switching module adapted to switch at least two of the symbols of the N symbols.

2. The barrel shifter according to claim 1, wherein the rearrangement module is adapted to provide, for a symbol received at an $i^{th}$ position in the N symbols provided by the first barrel shifters, said symbol at a $j^{th}$ position according to the following relationship:

$$j=\mathrm{mod}(i,n_1)*n_2+\mathrm{floor}(i/n_1)$$

where i is an integer between 0 and N−1, $\mathrm{mod}(i,n_1)$ is the remainder of the whole division of i by $n_1$ and $\mathrm{floor}(i/n_1)$ is the quotient of the whole division of i by $n_1$.

3. The barrel shifter according to claim 1, wherein the control module is adapted to provide the signal bs_ctrl1 according to the following relationship:

$$bs\_ctrl1=\mathrm{mod}(bs\_ctrl,n_1)$$

where $\mathrm{mod}(bs\_ctrl,n_1)$ is the remainder of the whole division of bs_ctrl by $n_1$, and adapted to provide the signal bs_ctrl2 according to the following relationship:

$$bs\_ctrl2=\mathrm{floor}(bs\_ctrl/n_1)$$

where $\mathrm{floor}(bs\_ctrl/n_1)$ is the quotient of the whole division of bs_ctrl by $n_1$, the barrel shifter further comprising an auxiliary rearrangement module adapted to receive the N symbols provided by the second barrel shifters and, for a symbol received at an $i^{th}$ position, to provide said symbol at a $j^{th}$ position according to the following relationship:

$$j=\mathrm{mod}(i,n_2)*n_1+\mathrm{floor}(i/n_2)$$

where i is an integer between 0 and N−1, $\mathrm{mod}(i,n_2)$ is the remainder of the whole division of i by $n_2$, and $\mathrm{floor}(i/n_2)$ is the quotient of the whole division of i by $n_2$, the switching module comprising N multiplexing modules, each multiplexing module receiving a first symbol at a relative position k, k being an integer between 1 and $n_1$, of the $n_1$ symbols provided by a first barrel shifter and a second symbol at said relative position k of the $n_1$ symbols provided by a first adjacent barrel shifter and providing the second symbol when k is less than or equal to bs_ctrl1 and the first symbol when k is greater than bs_ctrl1.

4. The barrel shifter according to claim 1, wherein the control module is adapted to provide the signal bs_ctrl1 according to the following relationship:

$$bs\_ctrl1=\mathrm{floor}(bs\_ctrl/n_2)$$

where $\mathrm{floor}(bs\_ctrl/n_2)$ is the quotient of the whole division of bs_ctrl by $n_2$, and adapted to provide the signal bs_ctrl2 according to the following relationship:

$$bs\_ctrl2=\mathrm{mod}(bs\_ctrl,n_2)$$

where $\mathrm{mod}(bs\_ctrl,n_2)$ is the remainder of the whole division of bs_ctrl by $n_2$, the barrel shifter further comprising an auxiliary rearrangement module adapted to receive the N symbols and to provide the N symbols to the first barrel shifters such that, for a symbol received at an $i^{th}$ position, said symbol is provided at a $j^{th}$ position according to the following relationship:

$$j=\mathrm{mod}(i,n_2)*n_1+\mathrm{floor}(i/n_2)$$

where i is an integer between 0 and N−1, $\mathrm{mod}(i,n_2)$ is the remainder of the whole division of i by $n_2$, and $\mathrm{floor}(i/n_2)$ is the quotient of the whole division of i by $n_2$, the switching module comprising N multiplexing modules, each multiplexing module receiving a first symbol at a relative position k, k being an integer between 1 and $n_2$, in the group of $n_2$ symbols amongst the N symbols received by said barrel shifter, and a second symbol at said relative position k in an adjacent group of $n_2$ symbols and providing, to the auxiliary rearrangement module, the first symbol when k is less than or equal to the difference between $n_2$ and bs_ctrl2 and the second symbol when k is greater than the difference between $n_2$ and bs_ctrl2.

5. A decoder comprising processors connected to memory elements and to a barrel shifter according to claim 1, wherein the processors and the memory elements are arranged in first and second concentric rings and in which the first and second barrel shifters of the barrel shifter are arranged in a third ring concentric to the first and second rings.

6. A decoder comprising a plurality of processors connected to a plurality of memory elements and a barrel shifter comprising $n_2$ first barrel shifters and $n_1$ second barrel shifters, wherein the plurality of processors and the plurality of memory elements are arranged, respectively, in first and second concentric rings and in which the first and second barrel shifters of the barrel shifter are arranged in a third ring concentric to the first and second rings, wherein the barrel shifter is configured to receive a number N of symbols in parallel, the N symbols being arranged in a number $n_2$ of distinct groups of a number $n_1$ of symbols, and to apply a total circular shift to the N symbols of a determined number of positions, the barrel shifter comprising:

the $n_2$ first barrel shifters, each first barrel shifter being configured to receive one of the distinct groups of $n_1$ symbols and to apply a first circular shift to said group of $n_1$ symbols, the first circular shift depending on the total circular shift, wherein at least one of the N symbols comprises at least two bits;

a rearrangement module configured to receive the N symbols provided by the first barrel shifters and to provide N symbols arranged, in a determined manner, in $n_1$ distinct groups of $n_2$ symbols;

the $n_1$ second barrel shifters, each second barrel shifter being configured to receive one of the distinct groups of $n_2$ symbols and to apply a second circular shift to said group of symbols, the second circular shift depending on the total circular shift; and a switching module configured to switch at least two of the symbols of the N symbols output from the second barrel shifters.

7. The barrel shifter according to claim 6, wherein the rearrangement module is configured to provide, for a symbol received at an $i^{th}$ position in the N symbols provided by the first barrel shifters, said symbol at a $j^{th}$ position according to the following relationship:

$$j=\text{mod}(i,n_1)*n_2+\text{floor}(i/n_1)$$

where i is an integer between 0 and N−1, $\text{mod}(i,n_1)$ is the remainder of the whole division of i by $n_1$ and $\text{floor}(i/n_1)$ is the quotient of the whole division of i by $n_1$.

8. A barrel shifter configured to receive a number N of symbols in parallel, the N symbols being arranged in a number $n_2$ of distinct groups of a number $n_1$ of symbols, and to apply a total circular shift to the N symbols of a determined number of positions, the barrel shifter comprising:

$n_2$ first barrel shifters, each first barrel shifter being configured to receive one of the distinct groups of $n_1$ symbols and to apply a first circular shift to said group of $n_1$ symbols, the first circular shift depending on the total circular shift, wherein at least one of the N symbols comprises at least two bits;

a rearrangement module configured to receive the N symbols provided by the first barrel shifters and to provide N symbols arranged, in a determined manner, in $n_1$ distinct groups of $n_2$ symbols;

$n_1$ second barrel shifters, each second barrel shifter being configured to receive one of the distinct groups of $n_2$ symbols and to apply a second circular shift to said group of symbols, the second circular shift depending on the total circular shift; and a control module configured to receive a signal bs_ctrl representing a total circular shift and to provide, to each first barrel shifter, a signal bs_ctrl1 representing the first circular shift, and configured to provide, to each second barrel shifter, a signal bs_ctrl2 representing the second circular shift, wherein the signal bs_ctrl1 is identical for each first barrel shifter and the signal bs_ctrl2 is identical for each second barrel shifter.

9. The barrel shifter according to claim 8, wherein the control module is configured to provide the signal bs_ctrl1 according to the following relationship:

$$bs\_ctrl1=\text{mod}(bs\_ctrl,n_1)$$

where $\text{mod}(bs\_ctrl,n_1)$ is the remainder of the whole division of bs_ctrl by $n_1$, and configured to provide the signal bs_ctrl2 according to the following relationship:

$$bs\_ctrl2=\text{floor}(bs\_ctrl/n_1)$$

where $\text{floor}(bs\_ctrl/n_1)$ is the quotient of the whole division of bs_ctrl by $n_1$.

10. The barrel shifter of claim 9, further comprising:

an auxiliary rearrangement module configured to receive the N symbols provided by the second barrel shifters and, for a symbol received at an $i^{th}$ position, to provide said symbol at a $j^{th}$ position according to the following relationship:

$$j=\text{mod}(i,n_2)*n_1+\text{floor}(i/n_2)$$

where i is an integer between 0 and N−1, $\text{mod}(i,n_2)$ is the remainder of the whole division of i by $n_2$, and $\text{floor}(i/n_2)$ is the quotient of the whole division of i by $n_2$.

11. The barrel shifter according to claim 8, wherein the control module is configured to provide the signal bs_ctrl1 according to the following relationship:

$$bs\_ctrl1=\text{floor}(bs\_ctrl/n_2)$$

where $\text{floor}(bs\_ctrl/n_2)$ is the quotient of the whole division of bs_ctrl by $n_2$, and configured to provide the signal bs_ctrl2 according to the following relationship:

$$bs\_ctrl2=\text{mod}(bs\_ctrl,n_2)$$

where $\text{mod}(bs\_ctrl,n_2)$ is the remainder of the whole division of bs_ctrl by $n_2$.

12. The barrel shifter of claim 8, further comprising:

an auxiliary rearrangement module adapted to receive the N symbols and to provide the N symbols to the first barrel shifters such that, for a symbol received at an $i^{th}$ position, said symbol is provided at a $j^{th}$ position according to the following relationship:

$$j=\text{mod}(i,n_2)*n_1+\text{floor}(i/n_2)$$

where i is an integer between 0 and N−1, $\text{mod}(i,n_2)$ is the remainder of the whole division of i by $n_2$, and $\text{floor}(i/n_2)$ is the quotient of the whole division of i by $n_2$.

13. A method of performing a total circular shift on a number N of symbols received in parallel, the N symbols being arranged in a number $n_2$ of distinct groups of a number $n_1$ of symbols, the method comprising:

applying, with $n_2$ first barrel shifters, a first circular shift to the distinct groups of $n_1$ symbols, wherein the first circular shift depends on the total circular shift, wherein at least one of the N symbols comprises at least two bits;

rearranging in a determined manner the N symbols provided by the first barrel shifters into $n_1$ distinct groups of $n_2$ symbols;

applying, with $n_1$ second barrel shifters, a second circular shift to the $n_1$ distinct groups of $n_2$ symbols, wherein the second circular shift depends on the total circular shift;

providing, to each first barrel shifter, a signal bs_ctrl1 representing the first circular shift, and providing, to each second barrel shifter, a signal bs_ctrl2 representing the second circular shift, wherein the signal bs_ctrl1 is identical for each first barrel shifter and the signal bs_ctrl2 is identical for each second barrel shifter; and switching at least two of the symbols output from the second barrel shifters.

14. The method of claim 13, wherein rearranging further comprises:

providing, for a symbol received at an $i^{th}$ position in the N symbols provided by the first barrel shifters, said symbol at a $j^{th}$ position according to the following relationship:

$$j=\mathrm{mod}(i,n_1)*n_2+\mathrm{floor}(i/n_1)$$

where i is an integer between 0 and N−1, $\mathrm{mod}(i,n_1)$ is the remainder of the whole division of i by $n_1$ and $\mathrm{floor}(i/n_1)$ is the quotient of the whole division of i by $n_1$.

15. A method of performing a total circular shift on a number N of symbols received in parallel, the N symbols being arranged in a number $n_2$ of distinct groups of a number $n_1$ of symbols, the method comprising:

applying, with $n_2$ first barrel shifters, a first circular shift to the distinct groups of $n_1$ symbols, wherein the first circular shift depends on the total circular shift, wherein at least one of the N symbols comprises at least two bits;

rearranging in a determined manner the N symbols provided by the first barrel shifters into $n_1$ distinct groups of $n_2$ symbols;

applying, with $n_1$ second barrel shifters, a second circular shift to the $n_1$ distinct groups of $n_2$ symbols, wherein the second circular shift depends on the total circular shift; and providing, to each first barrel shifter, a signal bs_ctrl1 representing the first circular shift, and providing, to each second barrel shifter, a signal bs_ctrl 2 representing the second circular shift, wherein the signal bs_ctrl1 is identical for each first barrel shifter and the signal bs_ctrl2 is identical for each second barrel shifter.

16. The method of claim 15, wherein the signal bs_ctrl1 is provided according to the following relationship:

$$bs\_\mathrm{ctrl1}=\mathrm{mod}(bs\_\mathrm{ctrl},n_1)$$

where $\mathrm{mod}(bs\_\mathrm{ctrl},n_1)$ is the remainder of the whole division of bs_ctrl by $n_1$, and wherein the signal bs_ctrl2 is provided according to the following relationship:

$$bs\_\mathrm{ctrl2}=\mathrm{floor}(bs\_\mathrm{ctrl}/n_1)$$

where $\mathrm{floor}(bs\_\mathrm{ctrl}/n_1)$ is the quotient of the whole division of bs_ctrl by $n_1$.

17. The method of claim 15, further comprising:

receiving the N symbols provided by the second barrel shifters and, for a symbol received at an $i^{th}$ position, providing said symbol at a $j^{th}$ position according to the following relationship:

$$j=\mathrm{mod}(i,n_2)*n_1+\mathrm{floor}(i/n_2)$$

where i is an integer between 0 and N−1, $\mathrm{mod}(i,n_2)$ is the remainder of the whole division of i by $n_2$, and $\mathrm{floor}(i/n_2)$ is the quotient of the whole division of i by $n_2$.

18. The method of claim 15, wherein the signal bs_ctrl1 is provided according to the following relationship:

$$bs\_\mathrm{ctrl1}=\mathrm{floor}(bs\_\mathrm{ctrl}/n_2)$$

where $\mathrm{floor}(bs\_\mathrm{ctrl}/n_2)$ is the quotient of the whole division of bs_ctrl by $n_2$, and the signal bs_ctrl2 is provided according to the following relationship:

$$bs\_\mathrm{ctrl2}=\mathrm{mod}(bs\_\mathrm{ctrl},n_2)$$

where $\mathrm{mod}(bs\_\mathrm{ctrl},n_2)$ is the remainder of the whole division of bs_ctrl by $n_2$.

19. The method of claim 15, further comprising:

providing the N symbols to the first barrel shifters such that, for a symbol received at an $i^{th}$ position, said symbol is provided at a $j^{th}$ position according to the following relationship:

$$j=\mathrm{mod}(i,n_2)*n_1+\mathrm{floor}(i/n_2)$$

where i is an integer between 0 and N−1, $\mathrm{mod}(i,n_2)$ is the remainder of the whole division of i by $n_2$, and $\mathrm{floor}(i/n_2)$ is the quotient of the whole division of i by $n_2$.

* * * * *